United States Patent
Kang

(10) Patent No.: US 7,615,843 B2
(45) Date of Patent: Nov. 10, 2009

(54) GUARD RING DEVICE RECEIVING DIFFERENT VOLTAGES FOR FORMING DECOUPLING CAPACITOR AND SEMICONDUCTOR DEVICE HAVING THE SAME

(75) Inventor: Khil Ohk Kang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/110,482

(22) Filed: Apr. 28, 2008

(65) Prior Publication Data

US 2008/0273286 A1 Nov. 6, 2008

(30) Foreign Application Priority Data

May 1, 2007 (KR) .................. 10-2007-0042387
Nov. 27, 2007 (KR) .................. 10-2007-0121490

(51) Int. Cl.
*H01L 27/105* (2006.01)

(52) U.S. Cl. ...................... 257/532; 257/528

(58) Field of Classification Search ............... 257/528, 257/532
See application file for complete search history.

(56) References Cited

U.S. PATENT DOCUMENTS

| 7,256,474 B2 * | 8/2007 | Wakayama et al. ......... 257/620 |
| 2003/0137243 A1 * | 7/2003 | Costello ..................... 313/523 |
| 2007/0241422 A1 * | 10/2007 | Chen ......................... 257/528 |

FOREIGN PATENT DOCUMENTS

KR 1020030002644 A 1/2003

* cited by examiner

*Primary Examiner*—Matthew Smith
*Assistant Examiner*—Christine Enad
(74) *Attorney, Agent, or Firm*—Ladas & Parry LLP

(57) ABSTRACT

A semiconductor device in which a decoupling capacitor is formed by supplying different power levels to a guard ring device is disclosed. The semiconductor device includes a guard ring, having conductive rings, which surrounds a memory chip. The conductive rings are stacked in a multi-player structure, and insulation layers are formed between the conductive rings. Voltages of different levels are applied to adjacent conductive rings.

6 Claims, 4 Drawing Sheets

GUARD RING DEVICE RECEIVING DIFFERENT VOLTAGES FOR FORMING DECOUPLING CAPACITOR AND SEMICONDUCTOR DEVICE HAVING THE SAME

CROSS-REFERENCE TO RELATED APPLICATIONS

The present application claims priority to Korean patent application number 10-2007-0042387 filed on May 1, 2007, and 10-2007-0121490 filed on Nov. 27, 2007, which is incorporated herein by reference in its entirety.

BACKGROUND OF THE INVENTION

The present invention relates to a semiconductor device, and more precisely to a semiconductor device in which a decoupling capacitor is formed by supplying voltages of different levels from each other to a guard ring device.

In semiconductor device fabrication, a spin on glass (SOG) layer is widely used for flattening, or planarizing the semiconductor device surface. An SOG layer has a good flattening characteristic and a good gap-filling characteristic between patterns, however reliability of a semiconductor having an SOG layer device may be reduced due to absorbed moisture because of an SOG layer is highly absorptive. The forming a guard ring in a semiconductor device has been suggested to prevent the moisture absorption into the SOG layer. The guard ring is formed to correspond to either the circumference of the device region or a scribe line and the guard ring protects the inside of a semiconductor device from the moisture.

FIG. 1 illustrates a semiconductor device formed with a conventional guard ring.

Referring to FIG. 1, a guard ring 20 is formed at the edge of a semiconductor device region 10 and a ground voltage (VSS) pad 11 is formed within the semiconductor device region 10. The ground voltage (VSS) pad 11 and the guard ring 20 are electrically connected through a metal line 12, and the guard ring 20 is supplied with a power provided through the ground voltage (VSS) pad 11.

The guard ring 20 and the pad 11 are connected through the metal line 12 because the semiconductor device becomes electrically unstable when the guard ring 20 is in an electrically floating state.

The VSS pad 11 supplies an external ground power to the semiconductor chip. The VSS pad 11 may be formed at a left portion of the semiconductor device region 10 as shown in FIG. 1, or alternatively may be formed at a right portion of the semiconductor device region 10.

FIG. 2 is a cross-sectional view of the conventional guard ring shown in FIG. 1, which is taken along line A-A'.

As shown in FIG. 2, an active region guard ring layer 21, a gate guard ring layer 23, a bit line guard ring layer 25, a first metal guard ring layer 27, and a second metal guard ring layer 29 are sequentially stacked in the guard ring 20, and insulation layers are formed between the respective layers. Also, the guard ring layers 21, 23, 25, and 29 are electrically connected through contacts 22, 24, 26, and 28. The metal line 12 connected with the guard ring 20, as shown in FIG. 1, corresponds to lines 21a, 23a, 25a, 27a, and 29a connected with the respective layers in FIG. 2.

A first contact 22 connects the active region guard ring layer 21 and the gate guard ring layer 23. A second contact 24 connects the gate guard ring layer 23 and the bit line guard ring layer 25. A third contact 26 connects the bit line guard ring layer 25 and the first metal guard ring layer 27. A fourth contact 28 connects the first metal guard ring layer 27 and the second metal guard ring layer 29.

The layers 21, 23, 25, 27, and 29 of the guard ring 20 are respectively connected with internal lines 21a, 23a, 25a, 27a, and 29a; and the VSS pad 11 is connected to a second VSS metal line 29a of the internal lines.

With the structure described above, the VSS pad 11 supplies an internal power through the second VSS metal line 29a to the guard ring 20.

In a conventional guard ring the guard ring exists in every layer to protect each layer of the semiconductor device.

The VSS power is applied to the metal layer to prevent the electrical instability as described above.

In order to prevent the electrical instability not only in the second metal guard ring layer 29 but also in the first metal guard ring layer 27, the second metal guard ring layer 29 and the first metal guard ring layer 27, of the guard ring 20, are electrically connected using the fourth contact 28. That is, the ground voltage VSS is also applied to the first metal line 27a and thus the first metal guard ring layer 27 is maintained in a stable voltage state.

Likewise, the ground voltage VSS is also applied to the bit line guard ring layer 25, the gate guard ring layer 23, and the active region guard ring layer 21 using the third contact 26, the second contact 24, and the first contact 22 respectively and thus the guard rings 25, 23, and 21 maintain electrical stability.

However, a conventional guard ring as described above only maintains electrical stability and cannot aid other electrical characteristics.

For example, a decoupling capacitor, preferably having a large capacity, is used in semiconductor devices to remove power line noise. However, device size is increased when a large number of such decoupling capacitors are used.

SUMMARY OF THE INVENTION

The present invention provides a semiconductor device in which decoupling capacitors are formed between respective layers of a guard ring.

The present invention also provides a semiconductor device in which a capacitor is formed in a guard ring and thus device stability can be increased.

Further the present invention provides a semiconductor device in which a capacitor device is provided in a guard ring and thus a device area can be reduced.

According to a first aspect of the present invention, there is provided a semiconductor device, which includes a multilayered guard ring having conductive rings to surrounds a memory chip, and an insulation layer formed between any two vertically stacked conductive rings, wherein voltages are applied to any two adjacent conductive rings are different.

Preferably, each conductive ring is electrically connected to a predetermined number of other non-adjacent the conductive rings.

Preferably, a plurality of voltage pads for supplying different level voltages are formed in the memory chip, and the voltage pads are connected to the vertically stacked conductive rings through one or more conductive lines.

Preferably, the voltage pads comprise a ground voltage pad and a power voltage pad.

Preferably, the N number of vertically stacked conductive rings is 5, the semiconductor device further comprises:

first through fourth metal lines for supplying voltage to the conductive layers are sequentially connected, and a first contact for connecting electrically the first metal line and the third metal line, a second contact for connecting electrically the third metal line and the fifth metal line and a third contact for connecting electrically the second metal line and the fourth metal line are formed.

Preferably, a fourth contact for connecting the fourth metal line and the power voltage line is additionally formed.

Preferably, the N number of vertically stacked conductive rings include X odd conductive rings and Y even conductive rings stacked in an alternating fashion, the ground voltage is supplied to the X odd conductive rings and the power voltage is supplied to the Y even conductive rings.

According to a second aspect of the present invention, there is provided semiconductor device, which includes a memory chip including a voltage pad, the voltage pad comprising a ground voltage pad for supplying a ground voltage and a power voltage pad for supplying a power voltage; and a guard ring device in which an N number of conductive layers are electrically connected with the ground voltage pad and power voltage pad and stacked, the N conductive layers comprising X odd conductive layers and Y even conductive layers stacked in an alternating fashion, wherein a capacitor is formed by supplying the ground voltage to the X odd conductive layers and supplying power voltage to the Y even conductive layers.

Preferably, the power voltage is supplied to the X odd conductive layers and the ground voltage is supplied to the Y even layers of the conductive layers.

Preferably, the N number of conductive layers are sequentially stacked and comprise an active region guard ring, a gate guard ring, a bit line guard ring, a first metal guard ring, and a second metal guard ring, wherein the active region guard ring, the bit line guard ring, and the second metal guard ring are electrically connected, and the gate guard ring and the first metal guard ring are electrically connected.

Preferably, the N number of conductive layers and the voltage pad are connected through a conductive line.

Preferably, the conductive line is a metal line formed between the second metal guard ring and the ground voltage pad.

Preferably, the conductive line is a metal line formed between the second metal guard ring and the power voltage pad.

Preferably, the metal line includes a first VDD metal line connected with the first metal guard ring and a second VDD metal line connected with the power voltage pad, and the first VDD metal line and the second VDD metal line are formed in different layers and connected through a contact.

According to a third aspect of the present invention, there is provided a guard ring, comprising a plurality of vertically stacked conductive layers and a plurality of insulation layers formed between vertically adjacent conductive layers, wherein each conductive layer is electrically connected to a predetermined number of other non-adjacent conductive layers.

Preferably, the voltages of different levels from each other are supplied to the conductive layers.

Preferably, the plurality conductive layers comprises X odd conductive layer and Y even conductive layers stacked in an alternating fashion, the X odd conductive layers are electrically connected, and the Y even conductive layers are electrically connected.

According to the present invention, it is possible to form a decoupling capacitor by applying different voltages from each other to a guard ring for protecting a semiconductor device.

Therefore, since it is possible to form a decoupling capacitor only with a guard ring without using separate capacitor device, it is possible to reduce a device area and enhance yield.

Also, according to the present invention, it is possible to prevent defect of a semiconductor chip by reducing variability of VDD power through the decoupling capacitor.

DESCRIPTION OF SPECIFIC EMBODIMENTS

The present invention discloses a semiconductor device which forms a decoupling capacitor by supplying different power levels to a guard ring.

Hereinafter, preferred embodiments of the present invention will be described in detail with reference to the accompanying drawings.

Figure 1:
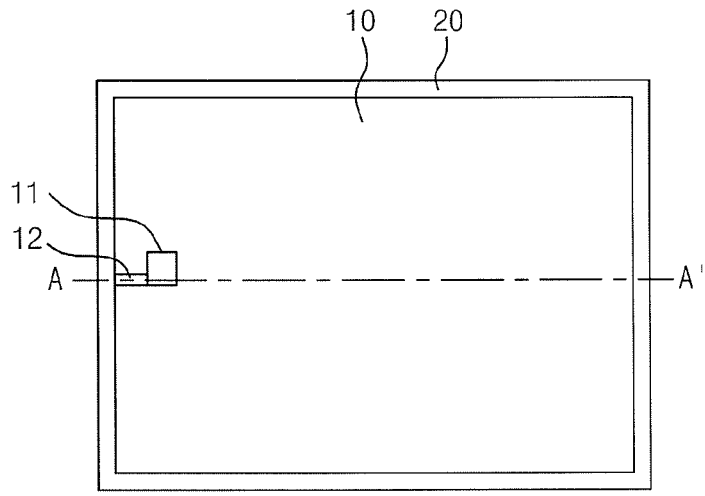
FIG. 1 is a plan view illustrating a conventional semiconductor device.
Figure 2:
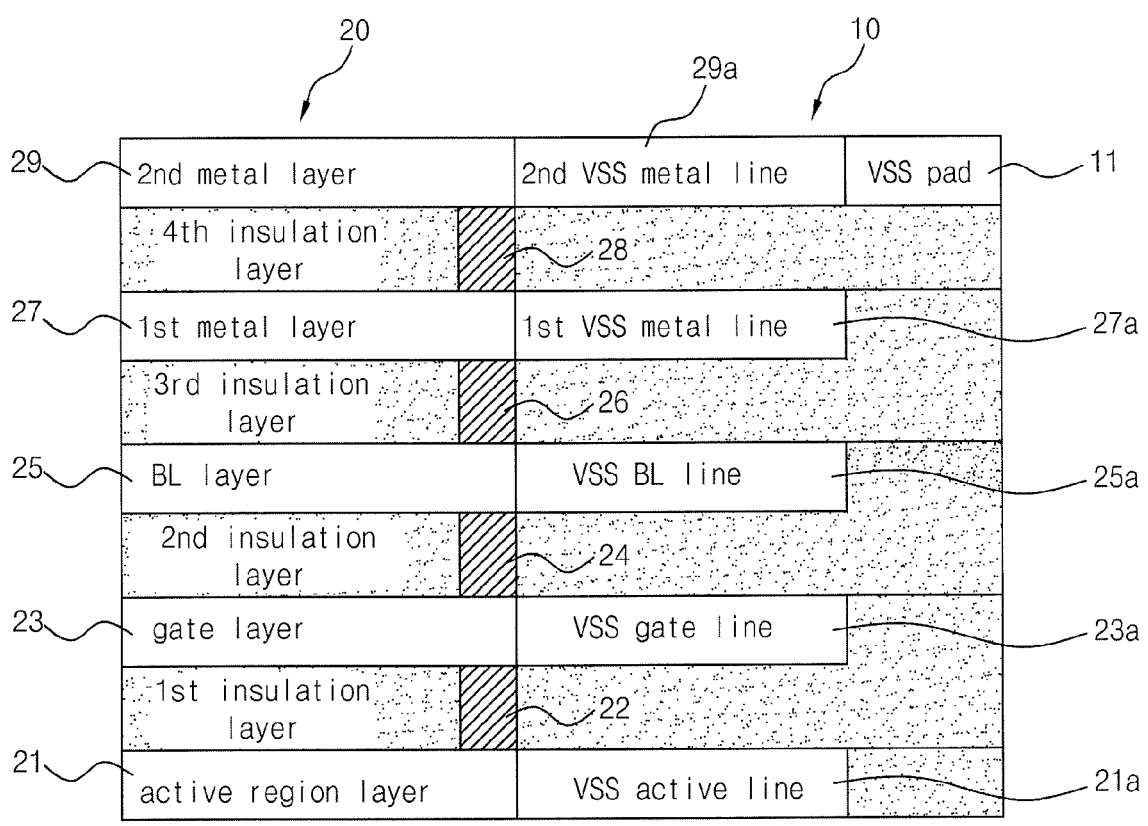
FIG. 2 is a cross-sectional view illustrating a conventional semiconductor device.
Figure 3:
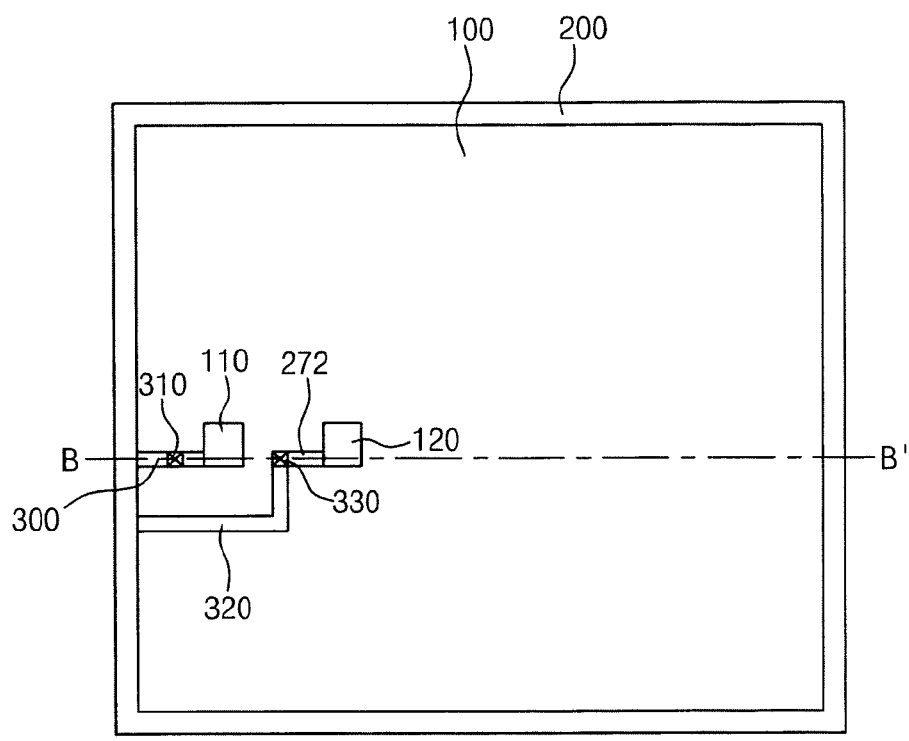
FIG. 3 is a plan view illustrating a semiconductor device according to an embodiment of the present invention.
Figure 4:
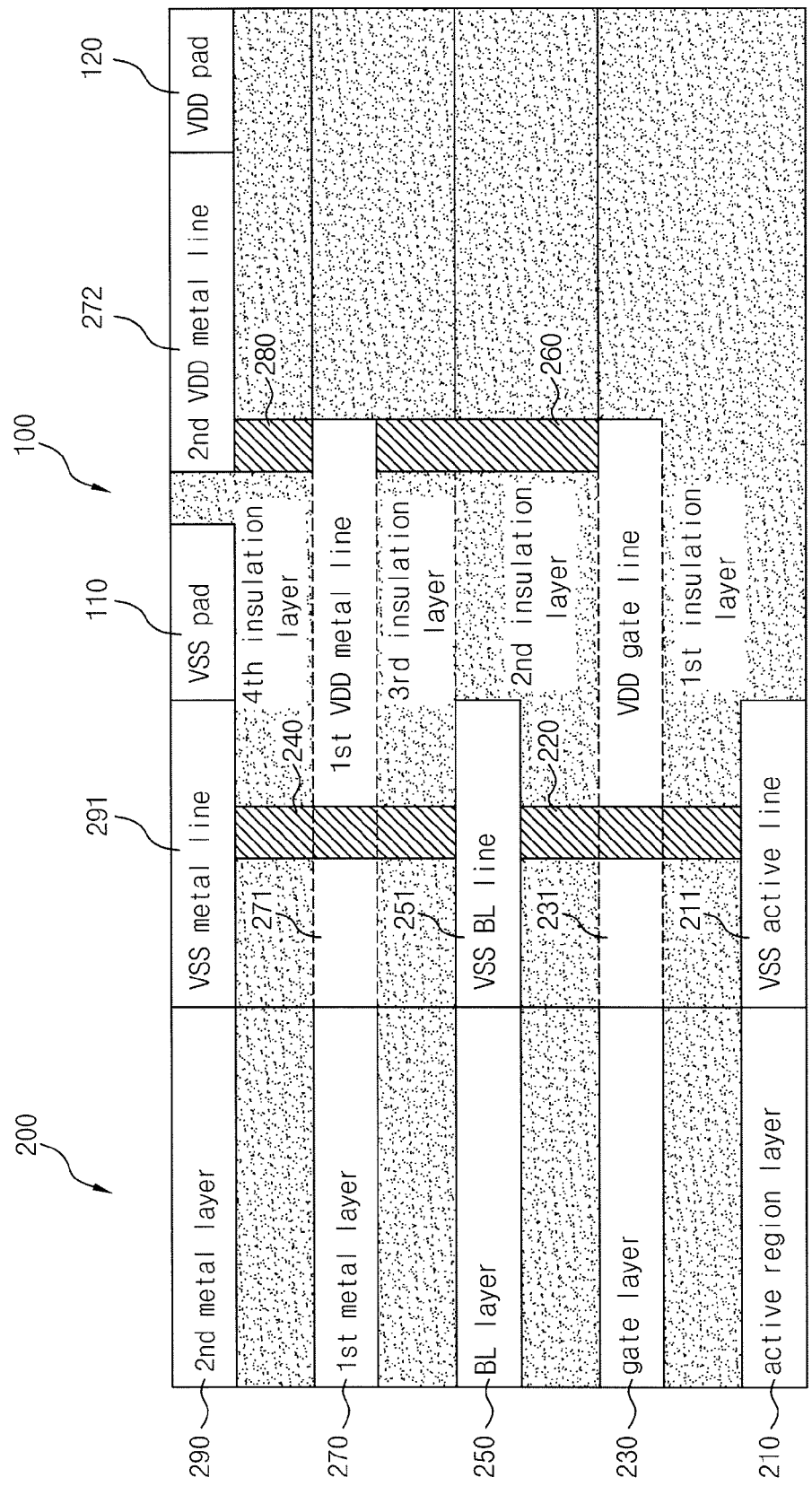
FIG. 4 is a cross-sectional view illustrating a semiconductor device according to an embodiment of the present invention.

FIG. 3 is a plan view illustrating a layout of a semiconductor device according to an embodiment of the present invention and FIG. 4 is a cross-sectional view taken along line B-B' of FIG. 3.

Referring to FIG. 3, a semiconductor device region 100 is surrounded by a guard ring 200 that is formed in a generally rectangular shape.

Conventional transistor and wiring patterns (not shown) are formed in the semiconductor device region 100, and a VSS pad 110 and a VDD pad 120 are formed at an upper portion of the semiconductor device region 100.

Herein, the VSS pad 110 may supply a ground voltage VSS to devices formed in the semiconductor device region 100 or what is separately formed for embodying the present invention. Also, the VDD pad 120 may supply an operation voltage VDD to the devices formed in the semiconductor device region 100 or what is separately formed for embodying the present invention. The VSS pad 110 and the VDD pad 120 are only an example of a voltage having a predetermined potential difference, and it is apparent to those skilled in the art that voltages having various potential differences may be applied to the pads 110 and 120 according to the manufacturer's intention.

The guard ring 200 is formed by stacking multiple layers of conductive wiring. The wirings included in the guard ring 200 may be formed with respect to a layer in which a conductive wiring is formed in the semiconductor device region 100. As shown in FIG. 4, the guard ring 200 of includes an active region layer 210, a gate layer 230, a bit line layer 250, a first metal layer 270 and a second metal layer 290, which are sequentially stacked and interlayer insulation layers (first to fourth insulation layers) are interposed therebetween.

As shown in FIG. 3, the VSS pad 110 and the guard ring 200 are electrically coupled through a conductive wiring 300, and the VDD pad 120 and the guard ring 200 are electrically coupled through conductive wirings 272 and 320. A contact 310 is formed on the conductive wiring 300 and a contact 330 is formed on the conductive wiring 272.

As shown in FIG. 4, the conductive wiring 300 includes, a VSS metal line 291, a VSS bit line 251, and a VSS active line 211, which are sequentially stacked, and interlayer insulation layers are interposed therebetween. The VSS metal line 291, the VSS bit line 251, and the VSS active line 211 are connected by contacts 240 and 220 formed therebetween and thus share the ground voltage VSS which is applied to the VSS pad 110. The contacts 220 and 240 correspond to the contact 310 formed on the conductive wiring 300 shown in FIG. 3.

The VSS metal line 291, the VSS bit line 251, and the VSS active line 211, which form the conductive wiring 300, are respectively connected with the second metal guard wiring 290, the bit line layer 250, and the active region layer 210. The conductive wiring 272 corresponds to a second VDD metal line 272, and the conductive wiring 320 corresponds to a first VDD metal line 271 and a VDD gate line 231, which are sequentially stacked below the second VDD metal line 272, and an interlayer insulation layer is interposed therebetween. The second VDD metal line 272, a first VDD metal line 271, and the VDD gate line 231 are connected by contacts 280 and 260 formed therebetween, and thus share a power voltage VDD applied to the VDD pad 120. The contacts 260 and 280 correspond to the contact 330 formed on the conductive wiring 272. The first VDD metal line 271 and the VDD gate line 231, included in the conductive wiring 320, are connected to the first metal layer 270 and the gate layer 230 respectively.

The wirings corresponding to the conductive wiring 300 and the wirings corresponding to the conductive wiring 320 are disposed at positions such that the conductive wiring 300 and the conductive wiring 320 do not overlap. The conductive wiring 300, the VSS pad 110, the second VDD metal line 272 and the VDD pad 120 are disposed in substantially the same line and the wirings corresponding to the conductive wiring 320 have such a shape that it's the end of the conductive wiring 320 is bent and then extended so as to form a contact with the second VDD metal line 272 positioned at the uppermost layer.

Therefore, the conductive wirings 272, 300, and 320 and the pads 110 and 120, formed on the semiconductor device region, are planarly disposed as shown in FIG. 3 and the cross-section along line B-B' of FIG. 3 is as shown FIG. 4. In FIG. 4, the first VDD metal line 271 and the VDD gate line 231 are not placed at the cross-section along line B-B' but are shown by broken lines for explanation.

The first to fourth insulation layers are formed between the respective guard ring layer and lines providing electrical separation. However, the conductive lines connected by the contact are electrically connected to the respective guard ring layers and thus can supply different voltage to predetermined guard ring layers.

In the structure described above, different voltages are supplied to both ends of an insulator, and therefore a capacitor is formed. That is, it is possible to form a capacitor utilizing only the guard ring and without using a separate capacitor device.

Specifically, the active region layer 210, the bit line layer 250, and the second metal layer 290 are electrically connected with the ground voltage VSS through the first contact 220 and the second contact 240. Therefore the ground voltage VSS is applied to the active region layer 210, the bit line layer 250, and the second metal layer 290.

The gate layer 230 and the first metal layer 270 are electrically connected with the power voltage VDD through the third contact 260 and the fourth contact 280. Therefore the power voltage VDD is applied to the gate layer 230 and the first metal guard ring.

Therefore, the guard ring layers are isolated from one another by the insulators, but the same voltage is applied to the layers connected through the contact.

Figure 5:
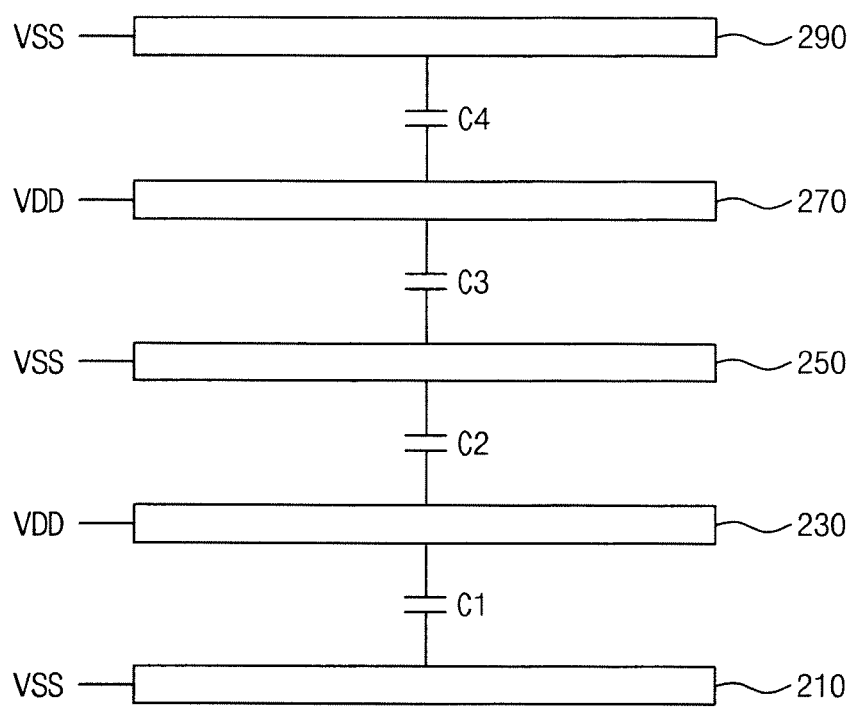
FIG. 5 is an equivalent circuit diagram of a decoupling capacitor formed according to the present invention.

FIG. 5 is an equivalent circuit diagram of the decoupling capacitor formed according to the present invention.

The ground voltage VSS is applied to the active region layer 210, the bit line layer 250, and the second metal layer 290, and the power voltage VDD is applied to the gate layer 230 and the first metal layer 270. Therefore, differences in voltage potential exist between the guard rings, and the first through fourth decoupling capacitors C1 through C4 are formed as shown.

The capacitance of a decoupling capacitor C1 through C4 can be obtained by dividing a dielectric constant by a thickness when the dielectric constant and the thickness are provided.

According to the present embodiment, the VSS voltage and the VDD voltage are supplied to the guard ring layers 210, 230, 250, 270, and 290 in an alternating fashion. However, according to the present invention, various voltages may be supplied to the guard ring layers 210, 230, 250, 270, and 290, and the contact may also be changed. For example, opposite voltages such as VBB or VPP may be supplied. That is, various voltages can be supplied since a capacitor can be formed when different voltages are supplied and thus voltage difference is generated between dielectric substances.

Also, even though the VSS pad and the VDD pad are not formed in the memory chip, it may be possible to form a capacitor by supplying different voltages to the guard ring device.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device, comprising:
 a memory chip including a voltage pad, the voltage pad comprising a ground voltage pad for supplying a ground voltage and a power voltage pad for supplying a power voltage; and
 a guard ring device in which an N number of conductive layers are electrically connected with the ground voltage pad and the power voltage pad and stacked, the N conductive layers comprising X odd conductive layers and Y even conductive layers stacked in an alternating fashion,
 wherein a capacitor is formed by supplying the ground voltage to the X odd conductive layers and supplying the power voltage to Y even conductive layers,
 wherein the N number of conductive layers are sequentially stacked and comprise an active region guard ring, a gate guard ring, a bit line guard ring, a first metal guard ring, and a second metal guard ring,
 wherein the active region guard ring, the bit line guard ring, and the second metal guard ring are electrically connected, and
 wherein the gate guard ring and the first metal guard ring are electrically connected.

2. The semiconductor device as set forth in claim 1, wherein the power voltage is supplied to the X odd conductive layers and the ground voltage is supplied to the Y even conductive layers.

3. The semiconductor device as set forth in claim 1, wherein the N number of conductive layers and the voltage pad are connected through a conductive line.

4. The semiconductor device as set forth in claim 3, wherein the conductive line is a metal line formed between the second metal guard ring and the ground voltage pad.

5. The semiconductor device as set forth in claim 3, wherein the conductive line is a metal line formed between the second metal guard ring and the power voltage pad.

6. The semiconductor device as set forth in claim 5, wherein the metal line includes a first VDD metal line connected with the first metal guard ring and a second VDD metal line connected with the power voltage pad, and the first VDD metal line and the second VDD metal line are formed in different layers and connected through a contact.

* * * * *